United States Patent
Minagawa

(10) Patent No.: US 6,233,083 B1
(45) Date of Patent: May 15, 2001

(54) LIGHT MODULATION APPARATUS AND OPTICAL INFORMATION PROCESSING SYSTEM

(75) Inventor: Noboru Minagawa, Tsurugashima (JP)

(73) Assignee: Pioneer Corporation, Tokyo-To (JP)

( * ) Notice: Subject to any disclaimer, the term of this patent is extended or adjusted under 35 U.S.C. 154(b) by 0 days.

(21) Appl. No.: 09/415,665

(22) Filed: Oct. 12, 1999

(30) Foreign Application Priority Data

Oct. 13, 1998 (JP) .................................................. 10-290423

(51) Int. Cl.[7] ...................................................... G02F 1/07
(52) U.S. Cl. ........................ 359/245; 359/259; 359/315; 359/322; 359/22; 356/355
(58) Field of Search ..................... 359/245, 253, 359/259, 260, 315, 321, 322, 10, 22; 356/355, 357

(56) References Cited

U.S. PATENT DOCUMENTS

| | | | |
|---|---|---|---|
| 4,071,841 | * 1/1978 | Kumada | 359/259 |
| 4,158,201 | * 6/1979 | Smith et al. | 359/259 |
| 5,157,537 | * 10/1992 | Rosenblatt | 359/245 |
| 5,157,538 | * 10/1992 | Soref | 359/245 |
| 5,198,920 | * 3/1993 | Gobeli et al. | 359/245 |
| 5,361,131 | * 11/1994 | Tekemori et al. | 356/355 |
| 5,526,171 | * 6/1996 | Warren | 359/245 |
| 5,949,558 | * 9/1999 | Psaltis et al. | 359/22 |

* cited by examiner

Primary Examiner—Loha Ben
(74) Attorney, Agent, or Firm—Ladas & Parry

(57) ABSTRACT

A light modulation apparatus includes: a light modulation device including first light transmission control elements each for controlling the amount of transmission of a light beam, for generating and applying a modulation light beam representing a modulation signal by controlling the amount of transmission of the light beam in each of the first light transmission control elements in accordance with the modulation signal; and a detection light beam generating device that always allows transmission of a part of the light beam for generating and applying a detection light beam for detecting a displacement of the irradiation position of the modulation light beam.

13 Claims, 6 Drawing Sheets

LIGHT MODULATION APPARATUS AND OPTICAL INFORMATION PROCESSING SYSTEM

BACKGROUND OF THE INVENTION

1. Field of the Invention

The present invention relates to a light modulation apparatus for modulating a light beam two-dimensionally and outputting the same, and an optical information processing system for applying a predetermined optical process to a light beam output from the light modulation apparatus.

2. Description of the Related Art

As an optical information processing system for modulating a light beam two-dimensionally and applying an optical process to the modulated light beam, an optical information recording and reproducing system using a so-called holographic memory (hereinafter referred to as an optical memory system) is known.

The optical memory system records an input signal in a holographic memory as a recording medium as follows. A recording signal light is applied with the spatial light modulation two-dimensionally based on the input signal. For the spatial light modulation of the input signal, a transparent type spatial light modulation apparatus comprising a plurality of pixels (specifically, a liquid crystal television comprising a plurality of pixels, or the like) is used. By interference between the recording signal light applied with the spatial light modulation and a recording reference light output independently, a two-dimensionally diffracted light is produced. Then, the image formed by the diffracted light is recorded in the holographic memory as the two-dimensional information corresponding to the input signal.

As the holographic memory, for example, a volume type hologram recording element formed by laminating a plurality of lithium niobate layers is used.

On the other hand, the above-mentioned optical memory system can reproduce the input signal by reading the two-dimensional information from the holographic memory wherein the two-dimensional information is recorded. The reproducing operation is executed as follows. A reproducing reference light is directed on the two-dimensional information on the holographic memory. At the time, the reproducing reference light is directed to the holographic memory with the same incident angle as the above-mentioned recording reference light. Then, the reflected light obtained thereby is received by a light receiving apparatus having a plurality of pixels. Accordingly, a light receiving signal is obtained from each pixel of the light receiving apparatus. Then, the original input signal is reproduced using the light receiving signals.

In the above-mentioned optical memory system, in order to correctly reproduce the original input signal from the holographic memory, it is needed that the relationship in position between the spatial light modulation apparatus and the light receiving apparatus is accurately determined and fixed. Furthermore, it is needed to set the holographic memory at a precise position.

However, if a movable portion is included in the spatial light modulation apparatus or the light receiving apparatus, or if the holographic memory itself is replaced frequently, displacement or positioning error may be generated in the optical memory system. The displacement in the spatial light modulation apparatus, the displacement in the light receiving apparatus, or the displacement of the holographic memory causes the displacement between the pixels in the spatial light modulation apparatus and the pixels in the light receiving apparatus. If such a displacement is generated, the original input signal cannot be reproduced correctly.

Specifically, if the displacement is generated, reflected light corresponding to a light beam output from a certain pixel in the spatial light modulation apparatus may not be incident on the correct pixel of the light receiving apparatus. In this case, the original input signal may not be reproduced correctly.

More specifically, in the normal state without displacement, for example, it is presumed that the reflected light corresponding to the light beam output from the pixel at the i row j column in the spatial light modulation apparatus is incident on the pixel at the $I_1$ row $J_1$ column in the light receiving apparatus. In this case, if displacement is generated by replacement of the holographic memory or the like, the reflected light to be incident on the pixel at the $I_1$ row $J_1$ column may be incident on the pixel at the $I_2$ row $J_2$ column. As a result, a correct light receiving signal is not obtained, so that the original input signal cannot be reproduced correctly.

SUMMARY OF THE INVENTION

An object of the present invention is to provide a light modulation apparatus capable of removing an influence of displacement of a movable portion or a detachable part and therefore executing the accurate optical process, and to provide an optical information processing system using the light modulation apparatus.

A light modulation apparatus in accordance with an aspect of the present invention includes: a light modulation device comprising a plurality of first light transmission control elements each for controlling an amount of transmission of a light beam, for generating and applying a modulation light beam representing a modulation signal by controlling the amount of transmission of the light beam in each of the plurality of first light transmission control elements in accordance with the modulation signal; and a detection light beam generating device that always allows transmission of a part of the light beam for generating and applying a detection light beam for detecting a displacement of an irradiation position of the modulation light beam.

The light modulation apparatus in accordance with the present invention generates and applies the detection light beam for detecting a displacement of the irradiation position of the modulation light beam. Therefore, in a light receiving apparatus, the displacement of the irradiation position of the modulation light beam can be detected by using the detection light beam so that the influence of the displacement can be removed when the received modulation light beam are processed. Furthermore, in the light modulation apparatus in accordance with the present invention, the detection light beam is generated by using a part of the light beam which is used for generating the modulation light beam. Therefore, the detection light beam can be generated easily, and the construction of the light modulation apparatus can be simplified.

In the aforementioned light modulation apparatus, a modulation panel may be added, and the detection light beam generating device may includes a second light transmission control element that always allows transmission of a part of the light beam. Furthermore, a modulation area and a detection area may be formed on the modulation panel. In this case, the modulation area and the detection area are separated from each other, the plurality of first light transmission control elements are arranged in the modulation area, and the second light transmission control element is placed in the detection area.

In this light modulation apparatus, the detection light beam is generated by transmitting the light beam through the second light transmission control element placed in the detection area. On the other hand, the modulation light beam is generated by the first light transmission control elements arranged in the modulation area. Since the modulation area and the detection area are separated from each other, the detection light beam is separated from the modulation light beam in location. That is, the irradiation position of the detection light beam is separated from the irradiation position of the modulation light beam in a light receiving apparatus. Therefore, the light receiving apparatus can accurately and easily detects the detection light beam.

In aforementioned light modulation apparatus, a quadrilateral panel may be used as the modulation panel. In this case, the modulation area whose area is smaller than the area of the quadrilateral modulation panel is formed at the center of the quadrilateral modulation panel, the plurality of first light transmission control elements are arranged in the modulation area. Furthermore, the detection light beam generation device may include four second light transmission control elements that always allow transmission of a part of the light beam, and the four second light transmission control elements may be placed at four corners of the quadrilateral modulation panel, respectively. Therefore, the detection light beam and the modulation light beam are clearly separated from each other, so that the light receiving apparatus can accurately and easily detects the detection light beam.

Alternatively, the four second light transmission control elements may be placed at middle points of four sides of the quadrilateral modulation panel, respectively.

An optical information processing system in accordance with another aspect of the present invention includes a light modulation apparatus for generating and applying a modulation light beam by modulating a light beam in accordance with a modulation signal, and a light receiving apparatus for generating a reception signal corresponding to the modulation light beam by receiving the modulation light beam applied by the light modulation apparatus. The light modulation apparatus includes: a light modulation device comprising a plurality of first light transmission control elements each for controlling an amount of transmission of the light beam, for generating and applying the modulation light beam representing the modulation signal by controlling the amount of transmission of the light beam in each of the plurality of first light transmission control elements in accordance with the modulation signal; and a detection light beam generating device that always allows transmission of a part of the light beam for generating and applying a detection light beam for detecting a displacement of an irradiation position of the modulation light beam. The light receiving apparatus includes: a reception signal generating device for receiving the modulation light beam applied by the light modulation apparatus and generating the reception signal corresponding to the received modulation light beam; a detection signal generating device for receiving the detection light beam and generating a detection signal corresponding to the received detection light beam; and a displacement determining device for detecting a displacement of an irradiation position of the detection light beam on the basis of the detection signal and determining the displacement of the irradiation position of the modulation light beam on the basis of the irradiation position of the detection light beam.

The light modulation apparatus generates and applies the detection light beam for detecting a displacement of the irradiation position of the modulation light beam. Therefore, in the light receiving apparatus, the displacement of the irradiation position of the modulation light beam can be detected, and the influence of the displacement can be removed when the received modulation light beam are processed. Furthermore, in the light modulation apparatus, the detection light beam is generated by using a part of the light beam which is used for generating the modulation light beam. Therefore, the detection light beam can be generated easily, and the construction of the light modulation apparatus can be simplified.

In the aforementioned optical information processing system, the light receiving apparatus may further includes a reception panel, and the reception signal generating device and the detection signal generating device may be provided with a plurality of light receiving elements arranged on the reception panel. In this case, the irradiation area of the detection light beam on the reception panel may be equal to or greater than the receiving area of one of the plurality of the light reception elements. Therefore, the detection light beam can be always received by at least one light reception elements, so that the irradiation position of the detection light beam can be accurately detected.

In the aforementioned optical information processing system, the displacement determining device may detect the irradiation position of the detection light beam by determining a position on the reception panel of one of the plurality of the light receiving elements that receives the detection light beam. Therefore, the accuracy of the detection of the irradiation position of the detection light beam can be increased.

In the aforementioned optical information processing system, an optical memory may be added. In this case, the optical memory is disposed between the light modulation apparatus and the light receiving apparatus. The optical memory records two-dimensional information included in the modulation light beam and position information included in the detection light beam when the modulation light beam and the detection light beam are applied to the optical memory together with a first reference light beam. Furthermore, the optical memory reproduces the modulation light beam including the recorded two-dimensional information and the detection light beam including the recorded position information when a second reference light beam is applied to the optical memory. The two-dimensional information corresponds to recording information included in the modulation signal, and the position information is information for detecting the displacement of the irradiation position of the modulation light beam. Therefore, the two-dimensional information recorded in the optical memory can be accurately reproduced, if a displacement between the light modulation apparatus and the light receiving apparatus or a displacement with respect to the optical memory is generated. Accordingly, the recording information included in the modulation signal can be accurately recorded in the optical memory and accurately reproduced from the optical memory.

The nature, utility, and further feature of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Referring to the accompanying drawings, embodiment of the present invention will be described. The embodiment described below is an embodiment wherein the present invention is embodied in an optical memory system for recording and reproducing information two-dimensionally by holography using laser light.

(1) Optical Memory System

Figure 1:
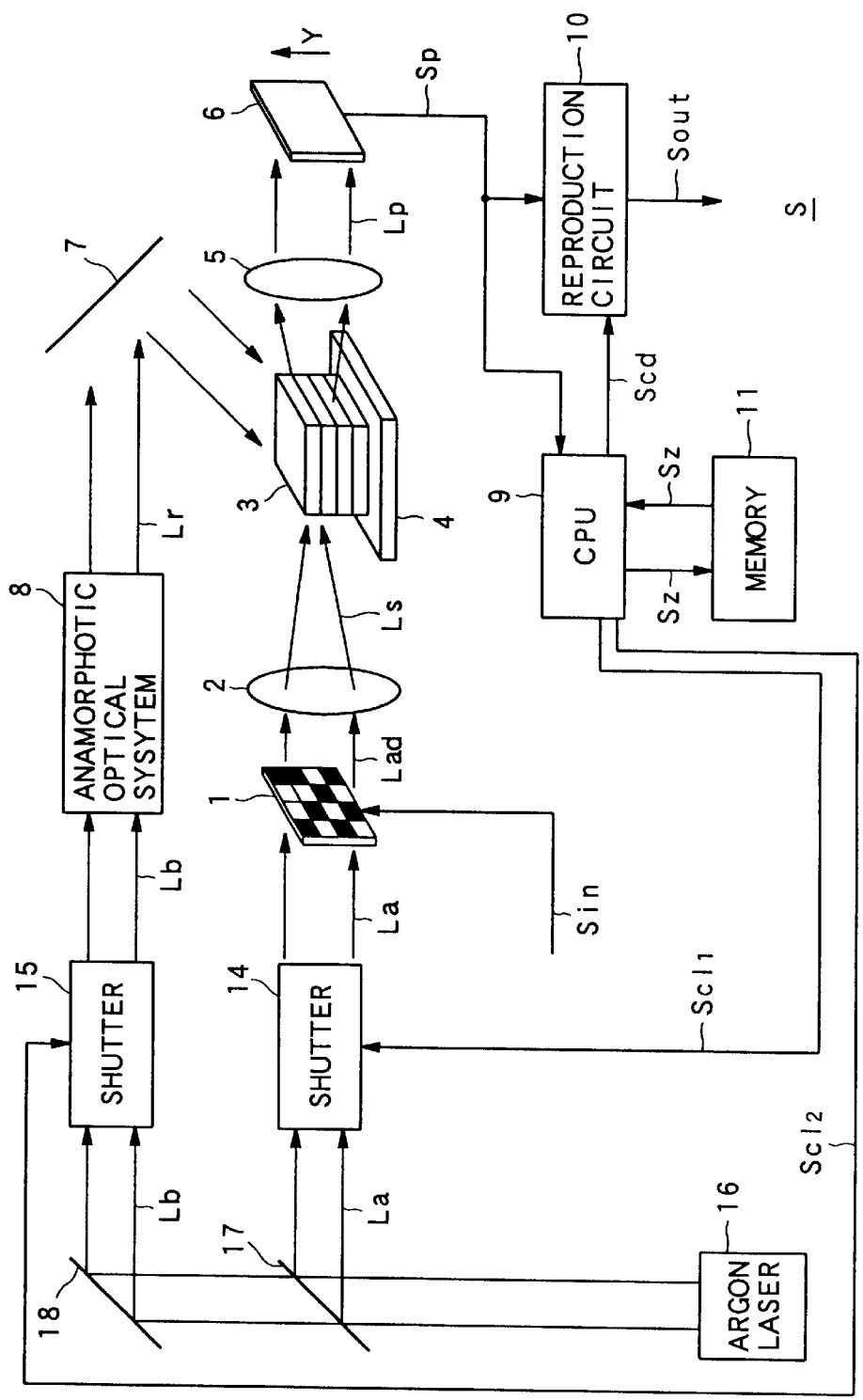
FIG. 1 is a block diagram showing the configuration of an optical memory system of an embodiment of the present invention.

The entire configuration and operation of an optical memory system according to the present embodiment will be explained with reference to FIG. 1. FIG. 1 shows the configuration of the optical memory system according to the present embodiment.

As shown in FIG. 1, the optical memory system S comprises a liquid crystal spatial light modulator 1 (LC spatial light modulator 1) having a modulation area including a plurality of modulation pixels, lenses 2 and 5, an optical memory 3, a Yθ stage 4, a CCD (Charge Coupled Device) element 6 having a light receiving area including a plurality of light receiving pixels each corresponding to the above-mentioned modulation pixels, mirrors 7 and 18, an anamorphotic optical system 8, a CPU 9, a reproduction circuit 10, a memory 11, an argon laser 16, a half mirror 17, and shutters 14 and 15.

Figure 2:
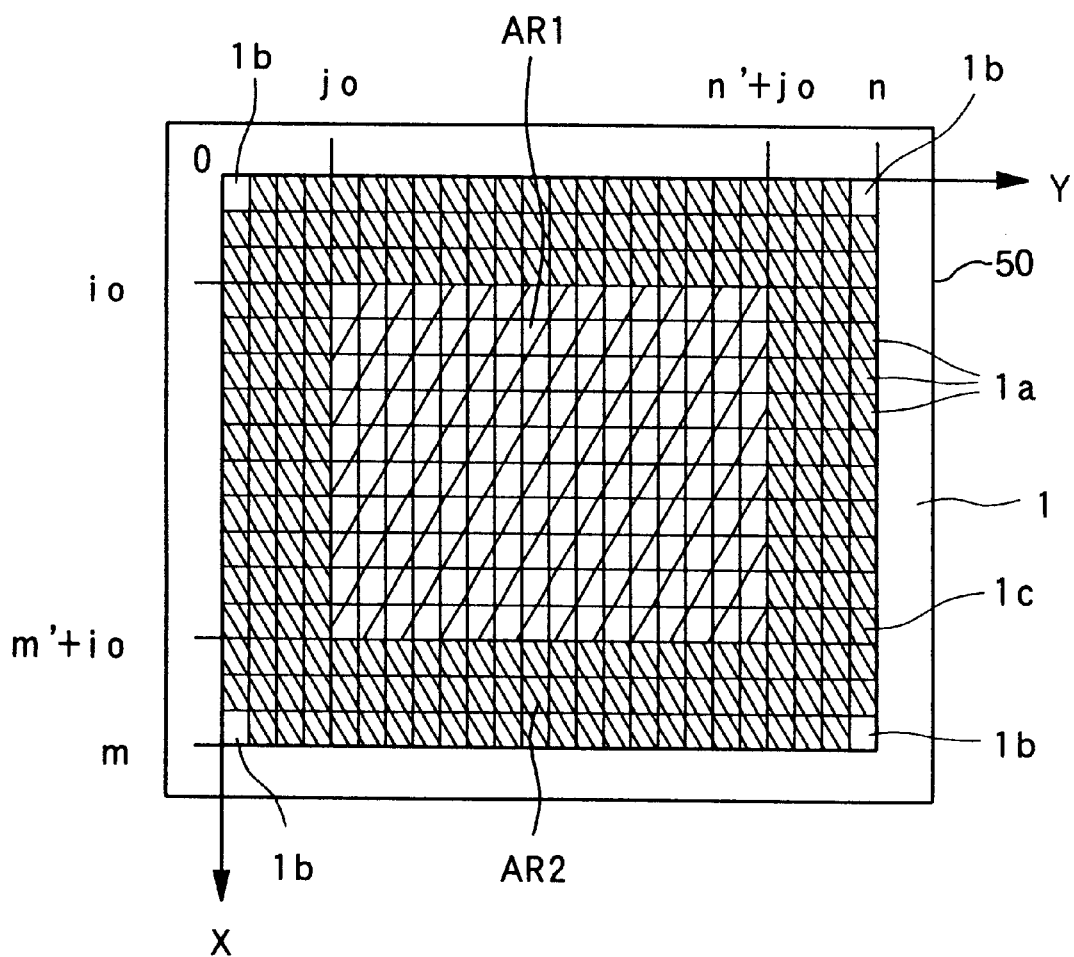
FIG. 2 is a plan view showing the configuration of a liquid crystal spatial light modulator.

The configuration of the LC spatial light modulator 1 will be explained with reference to FIG. 2. FIG. 2 shows the LC spatial light modulator 1 viewed from the lens 2 side.

As shown in FIG. 2, the LC spatial light modulator 1 has a quadrilateral modulation panel 50, and a quadrilateral modulation area 1c is formed at the center of the quadrilateral modulation panel 50. The modulation area 1c is formed by interposing a liquid crystal layer between transparent electrodes, divided per each modulation pixel 1a. Whether or not each modulation area 1a transmits a light beam is determined by changing the orientation of the liquid crystal layer corresponding to each modulation pixel 1a based on an input signal Sin described later. The orientation of the liquid crystal layer can be changed per each modulation pixel 1a. Accordingly, whether or not the modulation pixels transmit a light beam can be determined per each pixel 1a.

Moreover, four pixels disposed each on the four corners of the modulation area 1c function as a detection pixel 1b for detecting the displacement between the liquid crystal light modulator 1 and the CCD element 6. These detection pixels 1b are controlled so as to always transmit a light beam.

Figure 3:
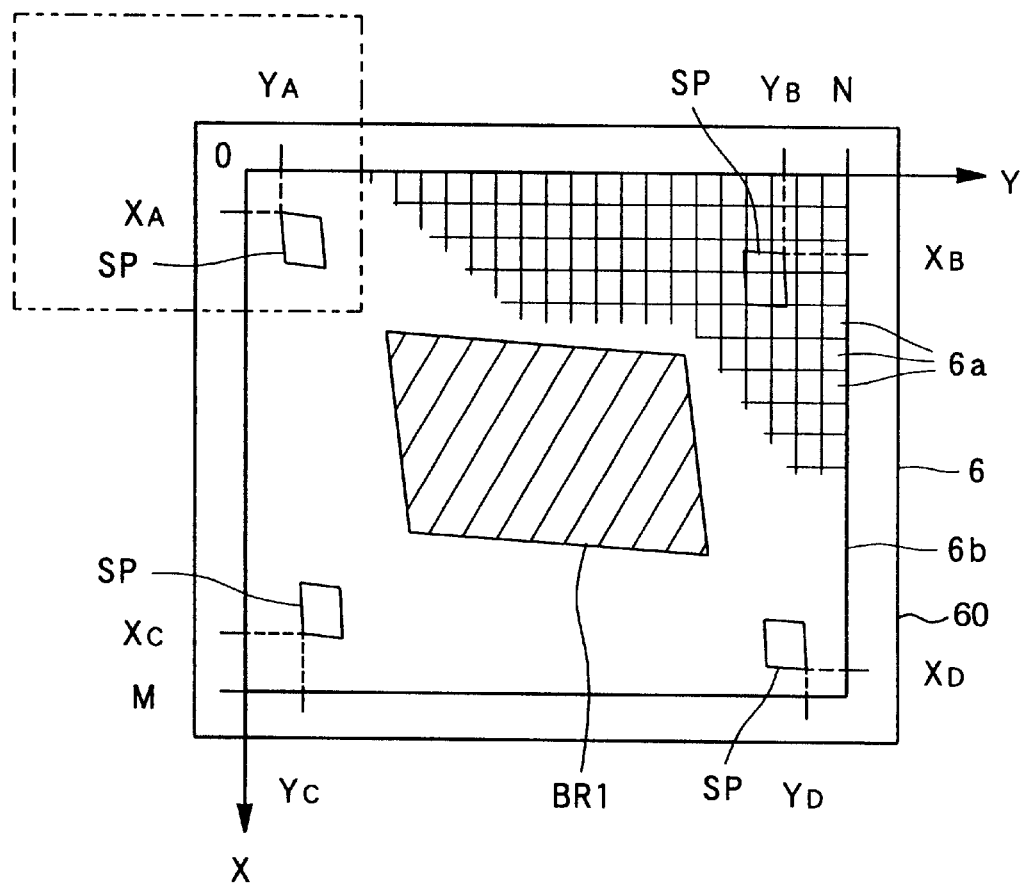
FIG. 3 is a plan view showing the configuration of a CCD element.

The configuration of the CCD element 6 will be explained with reference to FIG. 3. FIG. 3 is a plan view of the CCD element 6 viewed from the opposite side with respect to the lens 5.

As shown in FIG. 3, the CCD element 6 has a quadrilateral reception panel 60, and a quadrilateral light receiving area 6b is formed in the center thereof. The light receiving area 6b is provided with a plurality of light receiving pixels 6a each capable of receiving an incident light beam independently. If each light receiving pixel 6a is irradiated with a light beam, it outputs a CCD output signal Sp having an output level corresponding to the irradiation amount. The above-mentioned modulation area 1c as a whole corresponds to the irradiation area on the CCD element 6 irradiated with a reproduction signal light Lp. Then, the area of the light receiving area 6b is larger than the irradiation area on the CCD element 6.

The operation of the optical memory system S will be explained.

The operation at the time of recording information will be described.

In recording operation, an input signal Sin corresponding to the recording information to be recorded is applied to the LC spatial light modulator 1. Incidentally, the recording information is information expressible two-dimensionally, such as an image including sentences of one page.

At this time, the input signal Sin is applied so as to control each modulation pixel 1a independently. Moreover, the four detection pixels 1b are controlled as well by the input signal Sin. However, the four detection pixels 1b are controlled so as to always transmit a part of the laser light La. For example, the input signal Sin includes a control component for controlling the four detection pixels 1b accordingly.

Furthermore, in this embodiment, among all the modulation pixels 1a, only the modulation pixels 1a included in the area AR1 located at the center of the modulation area 1c are applied with the input signal Sin corresponding to the recording information. The modulation pixels 1a in the area AR2 disposed in the periphery are applied with the input signal Si for controlling so as not to transmit the laser light La. That is, the modulation pixels 1a in the area AR2 are always controlled so as not to transmit the laser light La. In FIG. 2, the roughly hatched area refers to the area AR1, and the finely hatched area refers to the area AR2.

On the other hand, during the operation, the shutter 14 conducts the laser light La output from the argon laser 16 onto the entirety of the modulation area 1c in the LC light modulator 1 based on a control signal $Scl_1$ from the CPU 9. In addition, the laser light La is output from the argon laser 16, reflected by the half mirror 17, and reaches to the shutter 14.

The laser light La is applied with the spatial light modulation process by the LC spatial light modulator 1 based on the input signal Sin. The spatial light modulation process is executed two-dimensionally by controlling transmission or non transmission of the laser light La for each modulation pixel 1a in the area AR1 based on the input signal Sin. As a result of this process, the detection laser light Lad including the recording information is generated. Furthermore, in the spatial light modulation process, the detection pixels 1b always allows transmission of the laser light La. Therefore, position information representing the relative positions of the detection pixels 1b is recorded in the detection laser light Lad. Thus, in the LC spatial light modulator 1, the detection laser light Lad including both the recording information and the position information representing the relative positions of the detection pixels 1b is generated, and then supplied to the lens 2.

Then, the detection laser light Lad is collected by the lens 2 so as to be directed to the information recording surface of the optical memory 3 as a signal light Ls.

The optical memory 3 here is placed on the Yθ stage 4 capable of moving or rotating the optical memory 3 in the Y direction (the vertical direction in FIG. 1) and in the θ direction (the rotation direction in the plane perpendicular to the central axis of the optical memory 3 parallel with the Y direction). Moreover, the optical memory 3 is formed by laminating thin layers of lithium niobate crystals.

The optical memory 3 is irradiated with the signal light Ls. During the irradiation of the signal light Ls, the shutter 15 supplies the laser light Lb output from the argon laser 16 to the anamorphotic optical system 8 based on the control signal $Scl_2$ from the CPU 9. In addition, the laser light Lb is output from the argon laser 16, transmits the half mirror 17, and is reflected by the mirror 18 so as to reach to the shutter 15. Moreover, the anamorphotic optical system 8 is an optical system having different magnifications depending on the direction in the plane perpendicular to the optical axis of the laser light Lb.

After being modulated by the anamorphotic optical system 8, the laser light Lb output from the shutter 15 is directed as a reference light Lr via the mirror 7 onto the irradiation position of the signal light Ls on the optical memory 3 at the same time. Accordingly, the signal light Ls and the reference light Lr interfere with each other at the irradiation position of the signal light Ls on the optical memory 3, so that the recording information and the position information corresponding to the position of the detection pixels 1b are recorded on the optical memory 3 as the two-dimensional information according to the hologram based on the interference.

The reproduction operation of the two-dimensional information recorded on the optical memory 3 will be explained.

In reproducing the two-dimensional information, the shutter 15 supplies the laser light Lb output from the argon laser 16 to the anamorphotic optical system 8 based on the control signal $Scl_2$ from the CPU 9. After being output from the argon laser 16 and transmitting the half mirror 17, the laser light Lb is reflected by the mirror 18 so as to reach to the shutter 15. Similar to the case of recording information, the laser light Lb is directed to the position of the optical system 3 at which the two-dimensional information to be reproduced is recorded, as the reference light Lr via the anamorphotic optical system 8 and the mirror 7.

Then, the reference light Lr is modulated by the two-dimensional information recorded on the optical memory 3 as well as reflected so that the reflected light reaches to the lens 5. Then, the reflected light is converted to a reproduction signal light Lp as a parallel light by the lens 5 so as to be incident on the light receiving surface of the CCD element 6. The CCD element 6 converts the reproduction signal light Lp into a CCD output signal Sp, which is an electric signal, by the pixels provided on the CCD element 6.

In the aforementioned recording operation, the recording information and the position information representing the relative positions of the detection pixels 1b are recorded on the optical memory 3. The reproduction signal light Lp therefore includes both the recording information and the position information, and thus the CCD output signal Sp output from the light receiving pixels 6a at the position at which the reproduction signal light Lp is directed includes the recording information and the position information.

It is preferable that the spatial position of each pixel 6a in the CCD element 6 corresponds to the spatial position of each modulation pixel 1a and detection pixel 1b included in the above-mentioned liquid crystal spatial modulator 1 per each corresponding pixels, however, it is difficult that they coincide with each other accurately.

The CCD output signal Sp output from the CCD element 6 is supplied to the reproduction circuit 10 and the CPU 9.

The CPU 9 receives the CCD output signal Sp so as to extract the position information corresponding to the detection pixels 1b among the CCD output signal Sp. The CPU 9 detects the displacement between the LC spatial light modulator 1 and the CCD element 6 (displacement detection process), on the basis of the extracted position information. Then, the CPU 9 generates a detection signal Scd showing the light receiving pixels 6a irradiated with the light beam of the portion corresponding to the recording information from the reproduction light Lp so as to output the same to the reproduction circuit 10. At the time of executing the above-mentioned displacement detection process, the CPU 9 stores necessary information in the memory 11 as a memory signal Sz, or read out the same from the memory 11 as needed. That is, the CPU 9 executes the displacement detection process by recording necessary information in the memory 11, or reading out the same from the memory 11.

The reproduction circuit 10 detects the light receiving pixels 6a irradiated with the light beam of the portion corresponding to the recording information from the reproduction signal light Lp so as to reproduce the CCD output signal Sp output form the light receiving pixels 6a. Accordingly, a reproduction signal Sout corresponding to the original recording information can be generated. Then, the reproduction signal Sout is output to the outside.

Here, the magnification α of the above-mentioned optical system (that is, the optical system including at least the lens 2 and 5, mirror 7 and the optical memory 3) is set such that the area of the irradiation area on the light receiving area 6b of the reflected light (reflected light at the time of information reproduction) of the reference light Lr corresponding to the signal light Ls corresponding to the detection laser light Lad completely includes at least one light receiving pixel 6a within the irradiation area. This is for receiving the reflected light of the reference light Lr corresponding to the signal light Ls corresponding to the detection laser light Lad completely by at least one light receiving pixel 6a so as to use the CCD output signal Sp output therefrom in the displacement detection process later described, executed in the CPU 9 at the time of information reproduction.

Figure 4A:
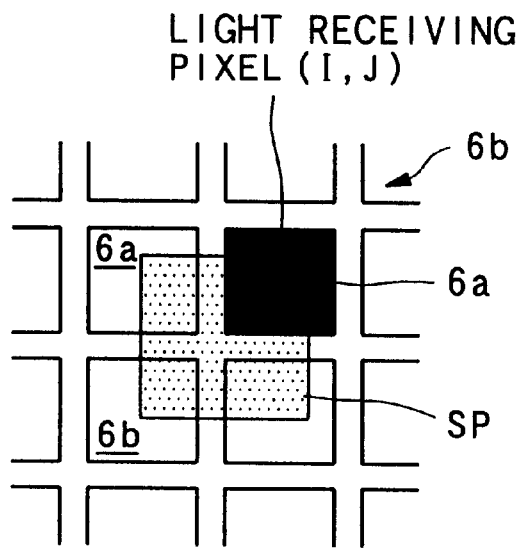
FIGS. 4A and 4B are diagrams for explaining the magnification of the optical memory system.
Figure 4B:
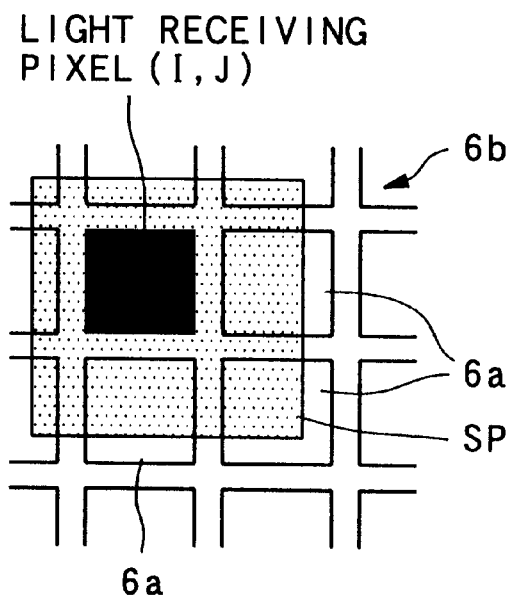

More specifically, in the case each pixel in the LC spatial light modulator 1 and the CCD element 6 is considered as a unit (in this case, with the premise that when the square area on the LC spatial light modulator 1 that x pieces of the modulation pixels 1 a are arrayed in one side corresponds to the square area on the light receiving area 6b that y pieces of the light receiving pixels 6a are arrayed in one side, the magnification α is identified as:

$$\alpha = y/x \tag{1},$$

the value of the magnification α needs to be "2" or more. The reason thereof is that, as shown in FIG. 4A, in the case the magnification α is less than "2", the light receiving pixel 6a at the I row J column in the light receiving area 6b, which should receive the reproduction signal light Lp modulated by the two-dimensional information on the optical memory 3, corresponding to the modulation pixel 1a or the detection pixel 1b at the I row J column may not be included completely in the irradiation area SP on the light receiving area 6b irradiated with the reproduction signal light Lp modulated by the two-dimensional information on the optical memory 3 corresponding to the modulation pixel 1a or the detection pixel 1b at the I row J column in the modulation area 1c, however, on the other hand, even in the case displacement is generated among the LC spatial light modulator 1, the optical memory 3 and the CCD element 6, with a "2" or more magnification α, the light receiving pixel 6a at the I row J column is completely included in the irradiation area SP as shown in FIG. 4B.

(II) Displacement Detection

The displacement detection operation according to the present invention to be executed at the time the detection signal Scd is generated in the CPU 9 will be explained with reference to FIGS. 2, 3, 5 and 6.

Setting of the coordinate axes to be the premise, or the like, will be explained with reference to FIGS. 2, 3 and 5.

Figure 5:
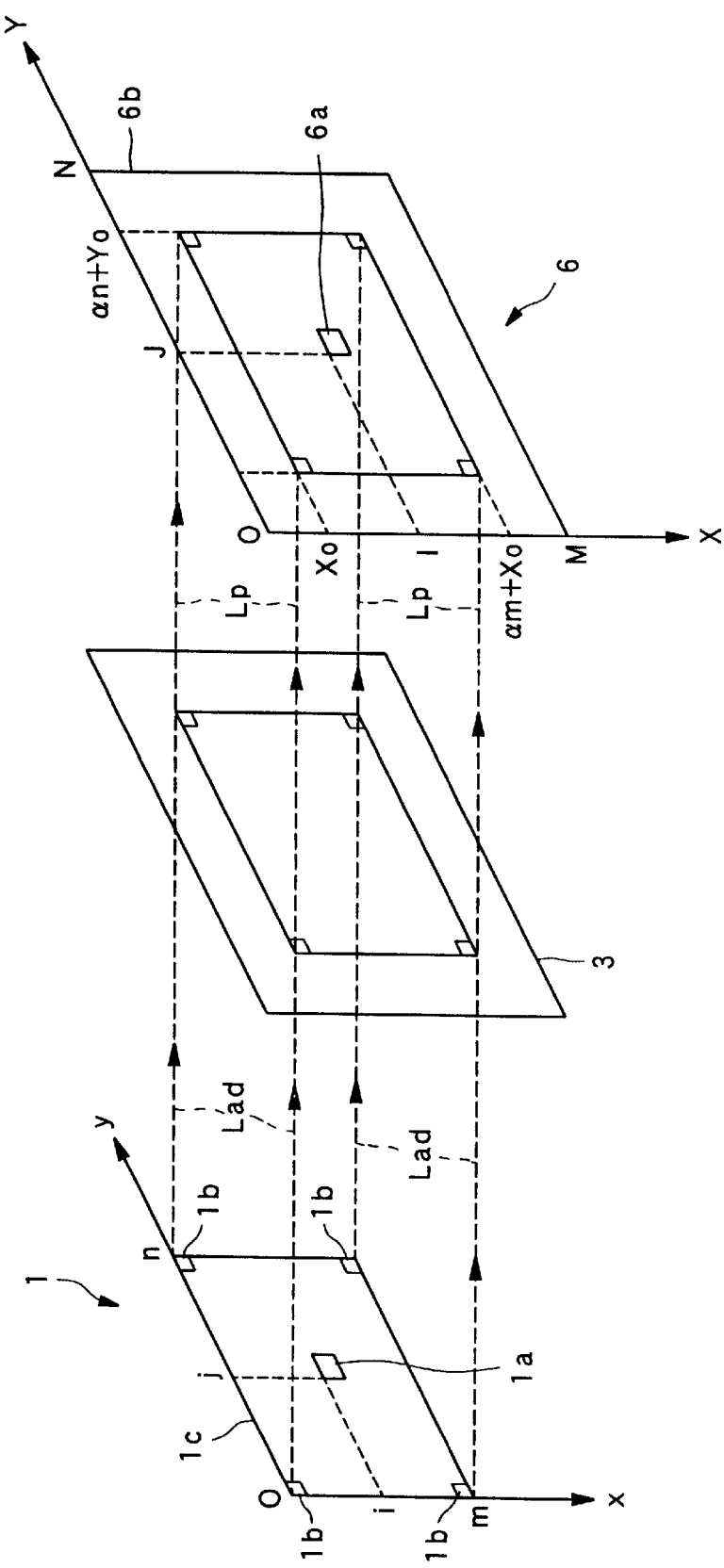
FIG. 5 is a diagram for explaining the configuration of the optical system in the optical memory system.

FIG. 5 schematically shows the optical path of the detection laser light Lad irradiated from the LC spatial light modulator 1 to the optical memory 3 at the time of recording two-dimensional information in the optical memory 3 and the optical path of the reproduction signal light Lp used in reproducing the two-dimensional information from the optical memory 3. In the actual optical memory system S, as shown in FIG. 1, the detection laser light is collected by the lens 2, and the reflected light from the optical memory 3 is converted to a parallel light by the lens 5, these lenses are omitted in FIG. 5 for facilitating understanding. Moreover, in FIG. 5, the optical path of the detection laser light Lad and the optical path of the reproduction signal light Lp are disposed on the same straight line for facilitating understanding.

In FIG. 5, the modulation area 1c in the LC spatial light modulator 1 is illustrated as an xy plane with the modulation pixel 1a as the basic unit. The modulation pixels 1a are disposed by m pieces in the x direction and n pieces in the y direction in the modulation area 1c. That is, the total number of the modulation pixels 1a in the modulation area 1c is m×n pieces. In the case the input signal Sin is recorded in the optical memory 3 as the two-dimensional information, the light strength distribution corresponding to the input signal Sin is formed in the modulation area 1c by driving each modulation pixel 1a based on the input signal Sin.

On the other hand, in FIG. 5, the light receiving area 6b of the CCD element 6 is illustrated as an XY plane with the light receiving pixel 6b as the basic unit. The light receiving pixels 6a are disposed by M pieces in the X direction and N pieces in the Y direction in the light receiving area 6b. That is, the total number of the light receiving pixels 6a in the light receiving area 6b is M×N pieces. In the case the two-dimensional information corresponding to the input signal Sin is read out from the optical memory 3 so as to be reproduced, the light strength distribution corresponding to the input signal Sin is projected on the light receiving area 6b.

Then, the area occupied by the modulation area 1c in the LC spatial light modulator 1 is presumed to be $0 \leq x \leq m$, and $0 \leq y \leq n$. Similarly, the area occupied by the light receiving area 6b in the CCD element 6 is presumed to be $0 \leq X \leq M$, and $0 \leq Y \leq N$. Furthermore, the magnification of the optical system is defined to be $\alpha$. Moreover, as shown in FIG. 5, the rectangular modulation area 1c having the two points (0, 0) and (m, n) diagonally is presumed to be projected on the rectangular area with the two points $(X_0, Y_0)$ and $(\alpha m + X_0, \alpha n + Y_0)$ in the light receiving area 6b. Moreover, in order to satisfy the presumptions, it is necessary that $M \geq \alpha m + X_0$, and $N \geq \alpha n + Y_0$.

Here, assuming that the modulation pixel 1a disposed at the i row j column from the coordinates (0, 0) on the modulation area 1c is referred to as a "modulation pixel (i, j)", and assuming that the coordinates (I, J) shows the position of the light receiving pixel 6a in the light receiving area 6b corresponding to the modulation pixel (i, j) in the case where there is no displacement between the liquid crystal light modulator 1 and the CCD element 6, the coordinates (I, J) can be given from the below-mentioned formula (2):

$$I = [\alpha(i+0.5)X_0]$$
$$J = [\alpha(j+0.5)Y_0] \quad (2).$$

In the formula (2), the reason why (i+0.5), (j+0.5) is that the central position of the modulation pixel (i, j) in the modulation area 1c is (i+0.5, j+0.5). Furthermore, in the formula (2), the mark of [ ] stands for that only the integers are picked up from the calculation value in the portion marked by the [ ] (the same is applied to the below-mentioned formulae).

In the case the optical system is set such that the value of $\alpha$ is "1" and both $X_0$ and $Y_0$ are an integer, the above-mentioned formula (2) is:

$$I = i + X_0$$
$$J = j + Y_0 \quad (3).$$

Moreover, in the case the value of $\alpha$ is not "1" or both $X_0$ and $Y_0$ are not an integer, since the magnification $\alpha$ of the optical system is set to be 2 or more in the optical memory system S according to this embodiment, a light receiving pixel 6a completely included in the irradiation area on the light receiving area 6b irradiated with the reproduction signal light Lp modulated by the two-dimensional information on the optical memory 3 corresponding to the modulation pixel 1a at the i row j column in the modulation area 1c always exists, that is, in other words, the reproduction signal light Lp modulated by the two-dimensional information on the optical memory 3 corresponding to the modulation pixels 1a at other than i row j column in the modulation area 1c is not directed on the light receiving pixel 6a at the I row J column in the light receiving area 6b.

The displacement detection process according to the present invention under the above-mentioned premises will be explained.

In the present embodiment, displacement between the LC spatial light modulator 1 and the CCD element 6 is detected by providing the detection pixels 1b at the four corners in the modulation area 1c for examining the irradiation position on the light receiving area 6b corresponding to each detection pixel 1b. As mentioned above, when recording the recording information, the detection pixels 1b always allow the part of the laser light La, so that the position information representing the relative positions of the detection pixels 1b is recorded in the detection laser light Lad together with the recording information, and the recording information and the position information is simultaneously recorded on the optical memory 3. When reproducing the recording information from the optical memory 3, the reproduction signal light Lp is generated on the basis of the recording information and the position information read from the optical memory 3, and the light receiving area 6b is irradiated with the reproduction signal light Lp. At the time, since the detection pixels 1b are disposed at four corners of the modulation area 1c (i.e., the position of each detection pixel 1b is located apart from the area AR1), the small light irradiation area corresponding to the detection pixels 1b appear near the four corners of the light receiving area 6b, as shown in FIG. 3.

If displacement between the LC spatial light modulator 1 and the CCD element 6 occurs, the irradiation position in the light receiving area 6b corresponding to the modulation pixel (i, j) is shifted from the coordinates (I, J) to the coordinates (I', J'), and, similarly, the irradiation position corresponding to each detection pixel 1b is off the predetermined position. In such a case, the coordinates (I', J') showing the actual position of the light receiving pixel 6a in the light receiving area 6b corresponding to the modulation pixel (i, j) is calculated on the basis of the irradiation position corresponding to each detection pixel 1b, so that the CCD output signal Sp actually corresponding to the input signal Sin which has driven the modulation pixel (i, j) is detected accurately based thereon.

The specific process will be explained with reference to FIGS. 2, 3, 5 and 6.

Since the detection pixels 1b are disposed at the four corners in the LC spatial light modulator 1, the area AR1 of the modulation pixel 1a actually driven by the input signal Sin is made smaller than the entire area of the modulation area 1c as mentioned above. Specifically, the total number of the modulation pixels 1a and the detection pixels 1b included in the modulation area 1c is defined to be m×n pieces, and on the other hand, the number of the modulation pixels 1a driven by the input signal Sin is set to be m'×n' pieces as shown in FIG. 2.

More specifically, (m'×n') pieces of the modulation pixels 1a from the $i_0$ row $j_0$ column to the (m'+$i_0$-1) row (n'+$j_0$-1) column in the modulation area 1c are driven by the input signal Sin.

On the other hand, the detection pixels 1b are set so as to always transmit the laser light La.

When the modulation pixels 1a and the detection pixels 1b in the modulation area 1c accordingly set are driven so as to record the two-dimensional information corresponding to the modulation pixels 1a and the detection pixels 1b in the optical memory 3 so that the reproduction signal light Lp corresponding to the recorded two-dimensional information is directed to the CCD element 6, as shown in FIG. 3, the areas BR1 and SP are formed in the light receiving area 6b. That is, the area corresponding to the area AR1 in the modulation area 1c is the area BR1, and the area corresponding to each detection pixel 1b is the area SP. In FIG. 3, the area BR1 is the portion marked with the slant lines downward leftward. Moreover, the coordinates of the four areas SP are each $(X_A, Y_A)$, $(X_B, Y_B)$, $(X_C, Y_C)$ and $(X_D, Y_D)$.

In FIG. 3, the areas BR1 and Sp are distorted. This means that the displacement between the LC spatial light modulator 1 and the CCD element 6 includes not only displacement in the direction parallel to the x axis or the y axis but also displacement in the rotation direction around an axis perpendicular to the modulation area 1c.

Figure 6:
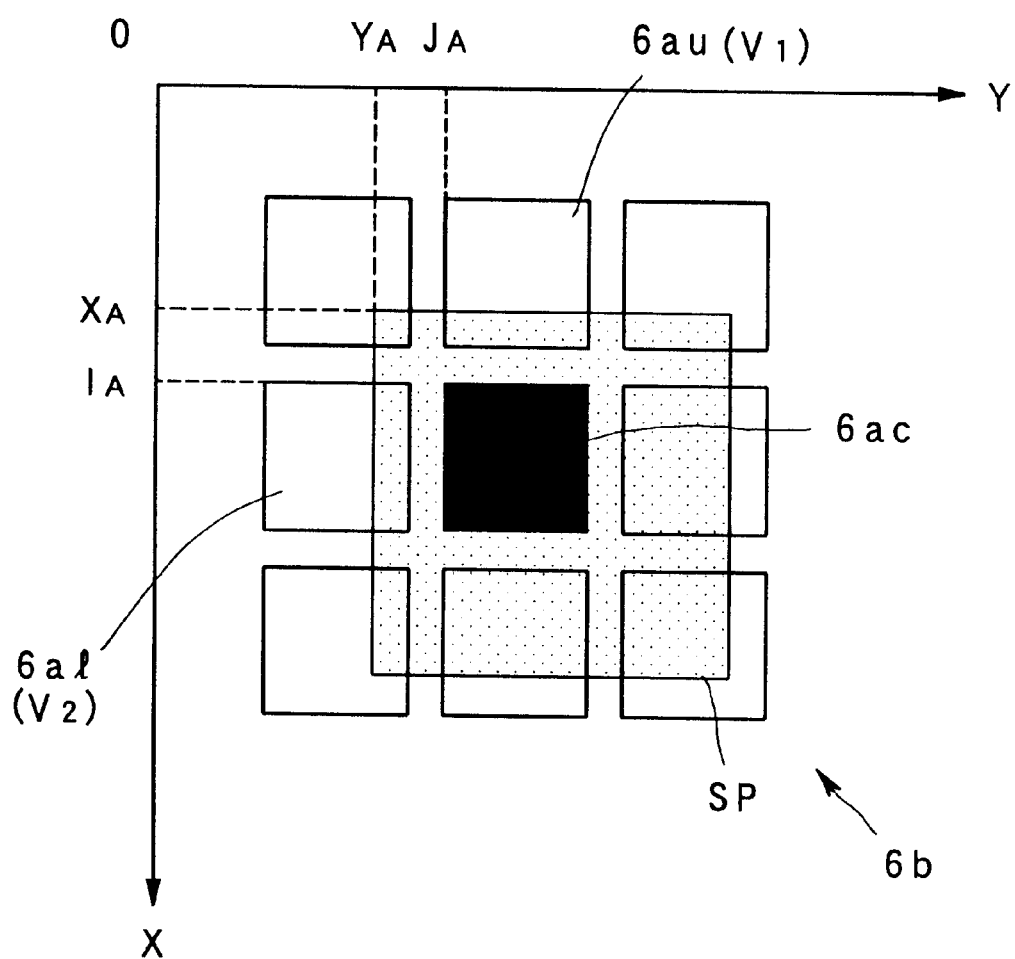
FIG. 6 is a diagram for explaining a displacement detecting process.

Calculation of the coordinates $(X_A, Y_A)$ among the coordinates of the irradiation position of the reproduction signal light Lp corresponding to the above-mentioned detection pixels 1b will be explained with reference to FIG. 6. FIG. 6 is an enlarged diagram of the portion surrounded by the double-dashed chain line in FIG. 3.

The irradiation position $(X_A, Y_A)$ of the reproduction signal light Lp corresponding to the detection pixels 1b is calculated in the following manner. In the light receiving area 6b shown in FIG. 3, the light receiving pixel 6a disposed at the most leftward and uppermost position is specified among the light receiving pixels 6a having the output "1". When the whole area of one light receiving pixel 6a is irradiated with the reproduction signal light Lp, the light receiving area 6a outputs "1". Hereinafter, a light receiving pixel specified accordingly is referred to as a "light receiving pixel 6ac". In the example of FIG. 6, the position of the light receiving pixel 6ac in the light receiving area 6b is $(I_A, J_A)$, that is, at the $I_A$ row $J_A$ column.

More specifically, the CCD output signal Sp from all the light receiving pixels 6a in the irradiation area SP is scanned rightward and downward successively. Then, among the light receiving pixels 6a having "1" as the output value, the light receiving pixel 6a detected first is specified as the light receiving pixel 6ac.

After specifying the light receiving pixel 6ac, the CCD output signal Sp output from the light receiving pixel 6a immediately above the light receiving pixel 6ac and the CCD output signal Sp output from the light receiving pixel 6a immediately on the left of the light receiving pixel 6ac are detected by the CPU 9. Here, the light receiving pixel 6a immediately above the light receiving pixel 6ac is defined to be a "light receiving pixel 6au". The light receiving pixel 6a immediately on the left of the light receiving pixel 6ac is defined to be a "light receiving pixel 6al". The CCD output signal Sp output from the light receiving pixel 6au is defined to be a "CCD output signal Spu" and the output value thereof $V_1$. The CCD output signal Sp output from the light receiving pixel 6al is defined to be a "CCD output signal Spl" and the output value thereof $V_2$. At the time, each of the values of the output values $V_1$ and $V_2$ is a value between "0" and "1".

Under the above-mentioned conditions, the coordinate values $(X_A, Y_A)$ are calculated by the below-mentioned formula:

$$X_A = I_A - V_1$$

$$Y_A = J_A - V_2 \qquad (4).$$

In the formula (4), each of the right hand values "$V_1$" and "$V_2$" is a value obtained each by dividing the output value $V_1$ of the CCD output signal Spu or the output value $V_2$ of the CCD output signal Spl by the maximum value of the CCD output signal Sp (non-dimensional number). Since the maximum value of the CCD output signal Sp is in general, "1", each output value is used as it is according to the formula (4).

In the same method as mentioned above, the other coordinates $(X_B, Y_B)$, $(X_C, Y_C)$ and $(X_D, Y_D)$ at the irradiation position of the reproduction signal light Lp corresponding to the detection pixels 1b can be calculated.

The conversion formula for obtaining the coordinates (I', J') showing the position of the light receiving pixels 6a actually irradiated with the reproduction signal light Lp modulated by the two-dimensional information on the optical memory 3 corresponding to the modulation pixel (i, j) when the LC spatial light modulator 1 and the CCD element 6 are displaced, using the coordinates $(X_A, Y_A)$, $(X_B, Y_B)$, $(X_C, Y_C)$ and $(X_D, Y_D)$ at each irradiation position of the reproduction signal light Lp corresponding to the detection pixels 1b calculated as mentioned above is produced as follows.

The formula for the linear transformation from the xy coordinate system showing the modulation area 1c to the XY coordinate system showing the light receiving area 6b is as follows:

$$X = A_1 xy + A_2 x + A_3 y + A_4$$

$$Y = B_1 xy + B_2 x + B_3 y + B_4 \qquad (5).$$

Since the points (0, 0), (0, n), (m, 0) and (m, n) on the modulation area 1c (xy plane) correspond to the points $(X_A, Y_A)$, $(X_B, Y_B)$, $(X_C, Y_C)$ and $(X_D, Y_D)$ on the light receiving area 6b (XY plane), each factor in the formula (5) can be calculated as follows:

$$A_1 = (X_A - X_B - X_C - X_D)/(m \times n)$$

$$A_2 = (X_C - X_A)/m$$

$$A_3=(X_B-X_A)/n$$

$$A_4=X_A$$

$$B_1=(Y_A-Y_B-Y_C-Y_D)/(m \times n)$$

$$B_2=(Y_C-Y_A)/m$$

$$B_3=(Y_B-Y_A)/n$$

$$B_4=Y_A \qquad (6).$$

From the above-mentioned formulae (5) and (6), the conversion formula for calculating the above-mentioned coordinate axes (I', J') is as follows:

$$I'=[A_1(i+0.5)(j+0.5)+A_2(i+0.5)+A_3(j+0.5)+A_4]$$

$$J'=[B_1(i+0.5)(j+0.5)+B_2(i+0.5)+B_3(j+0.5)+B_{4S}] \qquad (7).$$

Hereinafter, a detection signal Scd is generated based on the formula (7), and the detection signal Scd is output from the CPU 9 to the reproduction circuit 10. As a result, in the reproduction circuit 10, the CCD output signal Sp taken out from the light receiving pixel 6a at the I' row J' column in the light receiving area 6b is used as the CCD output signal Sp corresponding to the reproduction signal light Lp modulated by the two-dimensional information on the optical memory 3 corresponding to the modulation pixel (i, j) in the modulation area 1c. Accordingly, displacement between the LC spatial light modulator 1 and the CCD element 6 can be eliminated so that the input signal Sin can be reproduced accurately.

As heretofore explained, according to the operation of the optical memory system S of this embodiment, since the detection laser light Lad for detecting displacement between the LC spatial light modulator 1 and the CCD element 6 is produced by modulating a part of the laser light La by the detection pixels 1b other than the other modulation pixels 1a so that the displacement is detected based on the irradiation position on the CCD element 6, displacement included in the reproduction signal light Lp at the time of receiving the reproduction signal light Lp can be detected accurately.

Moreover, since at least one light receiving pixel 6a is included in the irradiation range of the reproduction signal light Lp corresponding to the detection pixels 1b, displacement can be detected further accurately based on the CCD output signal Sp from the at least one light receiving pixel 6a.

Furthermore, the irradiation position can be detected with the accuracy with the size of one light receiving pixel 6a as the unit by detecting the position of the light receiving pixels 6a included in the irradiation range of the reproduction signal Lp corresponding to the detection pixels 1b in the light receiving area 6b. And further, the irradiation position can be calculated by the accuracy of the decimal point or less with the size of one light receiving pixel 6a as the unit by using the CCD output signal Sp taken out from the adjacent light receiving pixels 6a (the output $V_1$ of the light receiving pixel 6au and the output $V_2$ of the light receiving pixel 6al in FIG. 6).

Moreover, since the reproduction signal light Lp corresponding to the four detection pixels 1b can be obtained independently, displacement can be detected further accurately by the use thereof.

Furthermore, since the detection pixel 1b is provided at the position corresponding to each corner of the quadrilateral modulation area 1c, four reproduction signal lights Lp corresponding to each corner of the modulation area 1c are output, displacement in the X direction and the Y direction can be detected with a simple process in detecting displacement from the irradiation position of each reproduction signal light Lp in the CCD element 6.

Moreover, even in the case the irradiation position of the reproduction signal light Lp on the CCD element 6 is displaced due to replacement of the optical memory 3, or the like, since the displacement can be detected accurately so that it is reflected in the subsequent process of the two-dimensional information using the produced CCD output signal Sp, the two-dimensional information can be reproduced accurately as the case wherein the reproduction signal light Lp is directed on the original irradiation position in the CCD element 6.

Moreover, since the detection pixels 1b are placed at the four corners in the modulation area 1c, displacement in the rotation direction around an axis perpendicular to the modulation area 1c can be detected.

(III) Modified Embodiment

Next, a modified embodiment according to the present invention will be explained.

Although the four modulation pixels 1a each positioned at the four corners in the modulation area 1c are used as the detection pixels 1b in the above-mentioned embodiment, a plurality of the modulation pixels 1a at the four corners can be used as the detection pixels 1b comprehensively as the first modified embodiment.

More specifically, for example, in the case the 2×2 modulation pixels 1a at the four corners of the modulation area 1c are used as the detection pixels 1b, the process corresponding to the above-mentioned formulae (4) to (7) can be executed with the light receiving pixel 6a at the most leftward and upward position among [2α]×[2α] pieces of the light receiving pixels 6a having "1" as the CCD output signal Sp output therefrom and receiving the reproduction signal light Lp corresponding to the detection pixels 1b.

At the time, in order to calculate the coordinate values ($X_A$, $Y_A$) based on the above-mentioned formula (4), the formula (4) can be adopted with the average output value of [2α] pieces of the adjacent light receiving pixels 6a immediately above the light receiving pixel 6a at the most leftward and upward position as $V_1$, and with the average output value of [2α] pieces of the adjacent light receiving pixels 6a immediately on the left of the light receiving pixel 6a at the most leftward and upward position as $V_2$. This modified embodiment is particularly effective for the case a large amount of noise is included in the reproduction signal light Lp.

Moreover, the method for calculating the above-mentioned coordinate values ($X_A$, $Y_A$) is not limited to the method shown by FIG. 6 and the formula (4) as the second modified embodiment.

That is, for example, the coordinate values ($X_A$, $Y_A$) can be calculated from the below-mentioned formula with the output value from the CCD output signal Sp from the light receiving pixel 6a at the $I_A$ row $J_A$ column as $V_0$, the output value from the CCD output signal Sp from the adjacent light receiving pixel 6a immediately above this as $V_1$, the output value from the CCD output signal Sp from the adjacent light receiving pixel 6a immediately above this as $V_1'$, and further the output value from the CCD output signal Sp from the adjacent light receiving pixel 6a immediately on the left of the light receiving pixel 6a at the $I_A$ row $J_A$ column as $V_2$, and further, the output value from the CCD output signal Sp from the adjacent light receiving pixel 6a immediately on the left of this as $V_2'$ so as to calculate each of them:

$$X_A=I_A-(V_1-V_1')/(V_0-V_1')$$

$$Y_A=J_A-(V_2-V_2')/(V_0-V_2') \qquad (8).$$

The method of calculating the coordinate values $(X_A, Y_A)$, or the like, from this formula is particularly effective for the case the offset (direct current component) is included in the CCD output signal Sp itself from the CCD element 6.

Furthermore, although the detection pixels 1b are provided at the four corners in the modulation area 1c in the above-mentioned embodiment, the detection pixels can be added in a position other than this in the modulation area 1c as the third modified embodiment.

More specifically, for example, the detection pixels 1b are added in the positions of the middle point of each side of the quadrilateral comprising the modulation area 1c, that is, the positions represented by the coordinate values (0, n/2), the coordinate values (m/2, 0), the coordinate values (m/2, n) and the coordinate values (m, n/2), and the coordinate values of the position of the light receiving area 6b irradiated with the reproduction signal light Lp corresponding to the four detection pixels 1b are defined each to be the coordinate values $(X_E, Y_E)$, the coordinate values $(X_F, Y_F)$, the coordinate values $(X_G, Y_G)$ and the coordinate values $(X_H, Y_H)$. Then, the below-mentioned formula can be used with the coordinate conversion formula corresponding to the above-mentioned formula (6) as the quadratic equation of x and y. That is, $$X = A_1 x^2 y + A_2 xy^2 + A_3 x^2 + A_4 xy + A_5 y^2 + A_6 x + A_7 y + A_8$$

$$Y = B_1 x^2 y + B_2 xy^2 + B_3 x^2 + B_4 xy + B_5 y^2 + B_6 x + B_7 y + B_8 \quad (9).$$

At the time, each factor is as follows. That is, $$A_1 = 2(X_B - X_A + X_D - X_C + 2X_F - 2X_G)/(m^2 \times n)$$

$$A_2 = 2(X_C - X_A + X_D - X_B + 2X_E - 2X_H)/(m \times n^2)$$

$$A_3 = 2(X_A + X_C - 2X_F)/m^2$$

$$A_4 = (5X_A - X_B - X_C - 3X_D - 4X_E - 4X_F + 4X_G + 4X_H)/(m \times n)$$

$$A_5 = 2(X_A + X_B - 2X_E)/n^2$$

$$A_6 = (4X_F - 3X_A - X_C)/m$$

$$A_7 = (4X_E - 3X_A - X_B)/n$$

$$A_8 = X_A$$

$$B_1 = 2(Y_B - Y_A + Y_D - Y_C + 2Y_F - 2Y_G)/(m^2 \times n)$$

$$B_2 = 2(Y_C - Y_A + Y_D - Y_B + 2Y_E - 2Y_H)/(m \times n^2)$$

$$B_3 = 2(Y_A + Y_C - 2Y_F)/m^2$$

$$B_4 = (5Y_A Y_B Y_C - 3Y_D - 4Y_E - 4Y_F + 4Y_G + 4Y_H)/(m \times n)$$

$$B_5 = 2(Y_A + Y_B - 2Y_E)/n^2$$

$$B_6 = (4Y_F - 3Y_A - Y_C)/m$$

$$B_7 = (4Y_E - 3Y_A - Y_B)/n$$

$$B_8 = Y_A. \quad (10).$$

In the case the detection pixels 1b are provided also at the middle point of each side of the modulation area 1c accordingly, displacement can be detected with a higher accuracy.

The same effect as the above-mentioned embodiment can be obtained by providing the detection pixels 1b only at the middle point of each side of the quadrilateral comprising the modulation area 1c (the positions represented by the coordinate values (0, n/2), the coordinate values (m/2, 0), the coordinate values (m/2, n) and the coordinate values (m, n/2)) in the above-mentioned third modified embodiment.

Furthermore, although the liquid crystal pixels transmitting the laser light La are used as the detection pixels in the above-mentioned embodiment, merely holes can be formed at the position to be the detection pixels 1b as the fourth modified embodiment. Moreover, the area not transmitting the laser light La in FIG. 2 (the area marked by the slant lines rightward downward in FIG. 2) can be provided merely as a light blocking wall.

In this case, the configuration for detecting displacement can be simplified.

Moreover, the cases of adopting the present invention to the optical memory system S have been explained in the above-mentioned embodiment and modified embodiments, for example, the present invention can be adopted in the case of detecting displacement in an optical information processing system wherein a laser light output from a modulation area 1c is received at a light receiving area 6b after transmitting merely a magnification changing lens, or the present invention can be adopted in the case of detecting displacement in an optical information processing system wherein a laser light output from a modulation area 1c is received at a light receiving area 6b after blocking a part thereof by merely a blocking mask.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. hei 10-290423 filed on Oct. 13, 1998 including the specification, claims, drawings and summary is incorporated herein by reference in its entirety.

What is claimed is:

1. A light modulation apparatus comprising:
   a light modulation device comprising a plurality of first light transmission control elements each for controlling an amount of transmission of a light beam, for generating and applying a modulation light beam representing a modulation signal by controlling the amount of transmission of the light beam in each of the plurality of first light transmission control elements in accordance with the modulation signal; and
   a detection light beam generating device that always allows transmission of a part of the light beam for generating and applying a detection light beam for detecting a displacement of an irradiation position of the modulation light beam.

2. The light modulation apparatus according to claim 1 further comprising a modulation panel, wherein the detection light beam generating device comprises a second light transmission control element that always allows transmission of a part of the light beam, a modulation area and a detection area are formed on the modulation panel, the modulation area and the detection area are separated from each other, the plurality of first light transmission control elements are arranged in the modulation area, and the second light transmission control element is placed in the detection area.

3. The light modulation apparatus according to claim 1 further comprising a quadrilateral modulation panel, wherein a modulation area whose area is smaller than an area of the quadrilateral modulation panel is formed at a center of the quadrilateral modulation panel, the plurality of first light transmission control elements are arranged in the modulation area, the detection light beam generation device comprises four second light transmission control elements that always allow transmission of a part of the light beam, and the four second light transmission control elements are placed at four corners of the quadrilateral modulation panel, respectively.

4. The light modulation apparatus according to claim 1 further comprising a quadrilateral modulation panel, wherein a modulation area whose area is smaller than an area of the quadrilateral modulation panel is formed at a center of the quadrilateral modulation panel, the plurality of first light transmission control elements are arranged in the modulation area, the detection light beam generation device comprises four second light transmission control elements that always allow transmission of a part of the light beam, and the four second light transmission control elements are placed at middle points of four sides of the quadrilateral modulation panel, respectively.

5. An optical information processing system comprising a light modulation apparatus for generating and applying a modulation light beam by modulating a light beam in accordance with a modulation signal, and a light receiving apparatus for generating a reception signal corresponding to the modulation light beam by receiving the modulation light beam applied by the light modulation apparatus, wherein:

the light modulation apparatus comprises:

a light modulation device comprising a plurality of first light transmission control elements each for controlling an amount of transmission of the light beam, for generating and applying the modulation light beam representing the modulation signal by controlling the amount of transmission of the light beam in each of the plurality of first light transmission control elements in accordance with the modulation signal; and a detection light beam generating device that always allows transmission of a part of the light beam for generating and applying a detection light beam for detecting a displacement of an irradiation position of the modulation light beam, and the light receiving apparatus comprises:

a reception signal generating device for receiving the modulation light beam applied by the light modulation apparatus and generating the reception signal corresponding to the received modulation light beam;

a detection signal generating device for receiving the detection light beam and generating a detection signal corresponding to the received detection light beam; and a displacement determining device for detecting a displacement of an irradiation position of the detection light beam on the basis of the detection signal and determining the displacement of the irradiation position of the modulation light beam on the basis of the irradiation position of the detection light beam.

6. The optical information processing system according to claim 5, wherein the light receiving apparatus further comprises a reception panel, and the reception signal generating device and the detection signal generating device comprise a plurality of light receiving elements arranged on the reception panel.

7. The optical information processing system according to claim 6, wherein an irradiation area of the detection light beam on the reception panel is not smaller than a receiving area of one of the plurality of the light reception elements.

8. The optical information processing system according to claim 6, wherein the displacement determining device detects the irradiation position of the detection light beam by determining a position on the reception panel of one of the plurality of the light receiving elements that receives the detection light beam.

9. The optical information processing system according to claim 5, wherein the detection light beam generating device comprises a plurality of the second light transmission control elements that always allow transmission of a part of the light beam.

10. The optical information processing system according to claim 5, wherein the light modulation apparatus further comprises a quadrilateral modulation panel, a modulation area whose area is smaller than an area of the quadrilateral modulation panel is formed at a center of the quadrilateral modulation panel, the plurality of first light transmission control elements are arranged in the modulation area, the detection light beam generation device comprises four second light transmission control elements that always allow transmission of a part of the light beam, and the four second light transmission control elements are placed at four corners of the quadrilateral modulation panel, respectively.

11. The optical information processing system according to claim 5, wherein the light modulation apparatus further comprises a quadrilateral modulation panel, a modulation area whose area is smaller than an area of the quadrilateral modulation panel is formed at a center of the quadrilateral modulation panel, the plurality of first light transmission control elements are arranged in the modulation area, the detection light beam generation device comprises four second light transmission control elements that always allow transmission of a part of the light beam, and the four second light transmission control elements are placed at middle points of four sides of the quadrilateral modulation panel, respectively.

12. The optical information processing system according to claim 5 further comprising an optical memory disposed between the light modulation apparatus and the light receiving apparatus, wherein the optical memory records two-dimensional information included in the modulation light beam and position information included in the detection light beam when the modulation light beam and the detection light beam are applied to the optical memory together with a first reference light beam, the optical memory reproduces the modulation light beam including the recorded two-dimensional information and the detection light beam including the recorded position information when a second reference light beam is applied to the optical memory, the two-dimensional information corresponds to recording information included in the modulation signal, and the position information is information for detecting the displacement of the irradiation position of the modulation light beam.

13. The optical information processing system according to claim 12, wherein the optical memory is a holographic memory.

* * * * *